United States Patent [19]
Watson

[11] Patent Number: 5,250,759
[45] Date of Patent: Oct. 5, 1993

[54] SURFACE MOUNT COMPONENT PADS

[76] Inventor: Troy M. Watson, 5672 E. Kelso St., Tucson, Ariz. 85712

[21] Appl. No.: 842,972

[22] Filed: Feb. 28, 1992

[51] Int. Cl.$^5$ .............................................. H05K 1/00
[52] U.S. Cl. .................................. 174/261; 174/267; 361/771
[58] Field of Search ............... 174/261, 251, 262, 267, 174/250; 361/400, 403, 428, 418

[56] References Cited

U.S. PATENT DOCUMENTS

| | | |
|---|---|---|
| 3,114,194 | 12/1963 | Lohs . |
| 4,679,321 | 7/1987 | Plonski . |
| 5,042,146 | 8/1991 | Watson . |
| 5,060,370 | 10/1991 | Scales, Jr. et al. . |
| 5,061,825 | 10/1991 | Catlin . |

Primary Examiner—Leo P. Picard
Assistant Examiner—Cheryl R. Figlin
Attorney, Agent, or Firm—J. E. McTaggart

[57] ABSTRACT

Pads for surface-mount components are formed in elongated rectangular openings in a circuit board directly from stripped portions of insulated hookup wire, thus eliminating additional interconnecting hardware parts and dependency on printed circuitry. For each pad, the wire is formed into a U shape by pressing the wire into the opening from a wiring side the circuit board with a press-driven mandrel shaped to place side portions of the loop at ends of the opening, and a solid, spring-loaded or adhesive filler inserted into the opening between the side wire portion to anchor the loop in place. The bridge portion of the loop, forming the pad, may be positioned so as to be recessed slightly below the circuit board surface so as to capture component leads in the depressed cavity with solder barriers between pads. Alternatively the pad may be located flush with the circuit board or slightly protruding, the location being determined by the travel of the press-driven mandrel. As a further alternative, the loop may be made to protrude prominently so as to form a terminal post which may be utilized for wire or component lead connection or for a test terminal. Wire pairs interconnecting pairs of such pads or protruding terminal loops may be twisted together in the process to provide twisted pair interconnection lines for high speed digital transmission. Interconnection wiring in accordance with this invention is highly compatible with the concept of forming helical terminals as taught by the inventor in U.S. Pat. No. 5,042,146, which may utilize identical or similar hookup wire and fabrication tooling in common with the present invention, including twisted pair aspects.

9 Claims, 2 Drawing Sheets

SURFACE MOUNT COMPONENT PADS

FIELD OF THE INVENTION

The present invention relates to fabrication of electronic circuitry, and more particularly it relates to a method of forming and interconnecting surface mount component pads in circuit boards directly from hookup wire.

BACKGROUND OF THE INVENTION

In the ongoing trend to further reduce the size of electronic components such as integrated circuits, advancement of the state of the art depends largely on solutions to interconnect components in high density. One solution is through the use of surface-mount components: packages with lead pitch of 0.025" (0.635 mm.) are becoming more common. In conventional practice it is common to form pads on a printed circuit board; however, where hookup wires need to be connected to the pads, difficulty in handling the wire and making the connections, typically by means of wire wrapping around a post and/or soldering, tends to create a troublesome and inefficient production "bottleneck".

U.S. Pat. No. 5,042,146, by the present inventor, discloses a process and apparatus for forming double-helix contact receptacles directly from hookup wire for interconnecting components independent of printed circuitry. The present invention is regarded as an extension of the teachings of Pat. No. 5,042,146 to include the forming of contact pads directly from hookup wire. Some of the apparatus of that patent, such as the vertical mandrel press, work table, and the wire processing mechanization including stripping, cutting, handling and supply are readily adaptable to the present invention which, like the inventor's earlier patent, addresses handling both single and twisted pair insulated hookup wire, and deals with the same sized wire: typically 30 gauge (AWG) having a diameter of 0.0125" which fits nicely into an array of connections requiring surfacemount pads with 0.025" pitch.

OBJECTS OF THE INVENTION

It is a primary object of the present invention to provide a method and apparatus for forming contact pads in circuit boards directly from stripped portions of insulated hookup wire.

It is further object to adapt the apparatus and extend the method to include the forming of terminals to serve as test points and interconnection terminals.

It is a still further object to provide pairs of contact pads formed from stripped portions of pairs of insulated hookup wire which may be formed into twisted pairs for interconnection runs between pairs of pads.

SUMMARY OF THE INVENTION

The objects of the invention have been achieved in the methods and apparatus disclosed herein in which a stripped portion of hookup wire is formed into a loop in place in a circuit board opening by means of a special mandrel in the fabrication apparatus, the loop being retained in place by a filler inserted into the loop.

BRIEF DESCRIPTION OF THE DRAWINGS

The above and further objects, features and advantages of the present invention will be more fully understood from the following description taken with the accompanying three-dimensional drawings in which.

DETAILED DESCRIPTION

Figure 1:
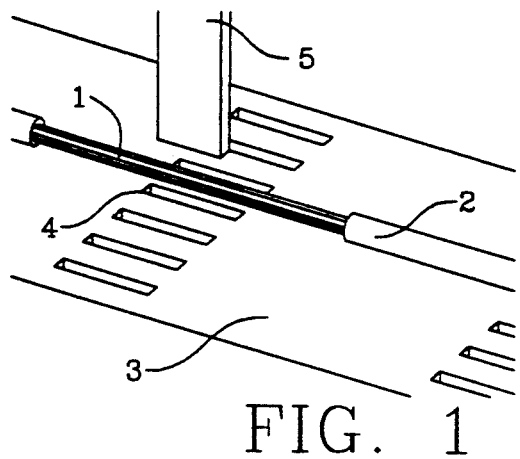
FIGS. 1-4 show four stages in a process of forming a pad from hookup wire in a circuit board opening in accordance with the present invention.

In FIG. 1, a stripped portion 1 of insulated hookup wire 2 to be installed into a circuit board 3 is placed over an elongated rectangular opening 4, one of an array in board 3 which is supported on a work table. A mandrel 5, having an elongated rectangular cross section, is constrained to vertical travel in an overhead press mechanism, not shown.

Figure 2:
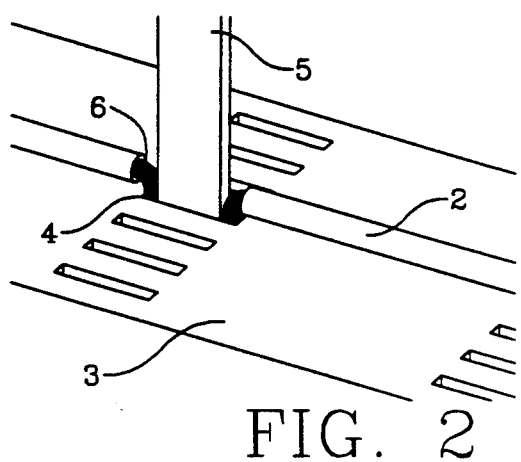

In FIG. 2 mandrel 5 has been driven downwardly where it has engaged the stripped portion of wire 2, forcing it into opening 4 of board 3, thus forming a loop 6 and drawing the insulated portion of the wire 2 close to opening 4.

Figure 3:
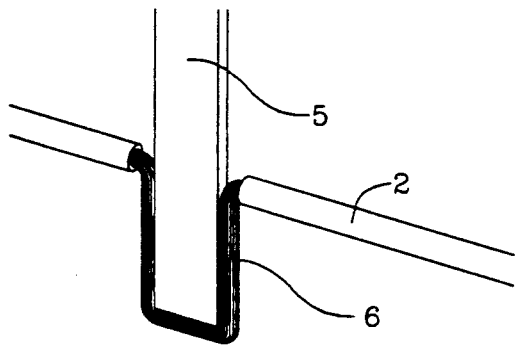

FIG. 3 shows the shape of the wire loop 6 as formed (as in FIG. 2) by mandrel 5 into a U shape with a flat bridge wire portion at the bottom.

Figure 4:
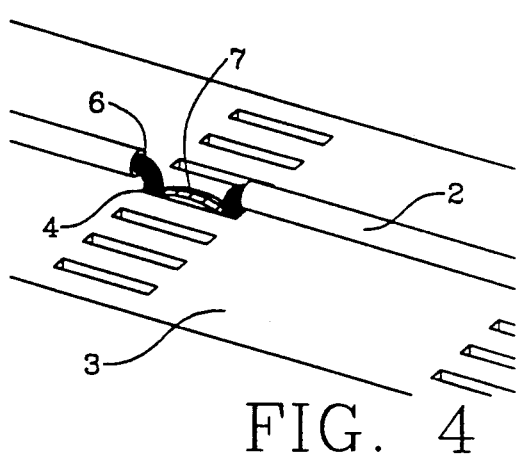

FIG. 4 shows the loop 6, as formed in FIGS. 2 and 3, following removal of the mandrel, secured in place by a filler 7, which may be a solid plug wedged in place or a suitable time-setting fastening material such as epoxy for holding the loop 6 in place in opening 4.

Figure 5:
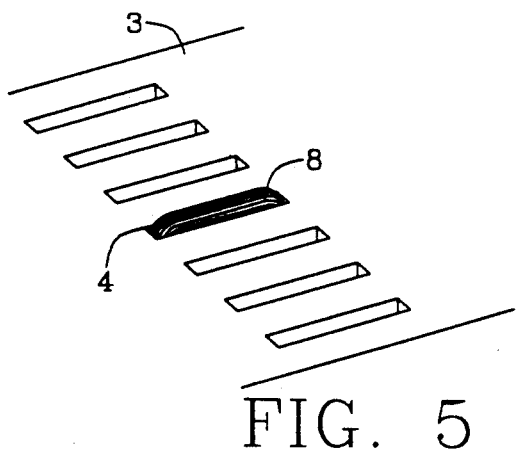
FIG. 5 is a view of a circuit board, showing the side opposite that shown in FIGS. 1-3, with a pad formed in accordance with the present invention.

FIG. 5 is a view of circuit board 3, inverted from the a previous orientation shown in FIGS. 1-4, showing on the component side the loop bridge with its upper surface forming a pad 8 secured in the opening 4.

In an alternative to fixing pad 8 rigidly in circuit board 3, filler 7 may be fabricated in a manner to captivate loop 6 with some degree of vertical freedom and to include a metallic spring part or member providing resilience in a vertical direction so as to enable pad 8 to act as a spring-loaded contact which would have the advantage of maintaining equal contact force on multiple contacts of a surface mount component to thus accommodate any non-uniformity of the component contact members.

As on option, filler (7, FIG. 4) could be configured to provide, at the surface level of circuit board 3, one or more extending metal tabs adapted to provide electrical contact between adjacent pads such as pad 8 in an array of openings such as opening 4, where inter-pad contact is required.

Figure 6:
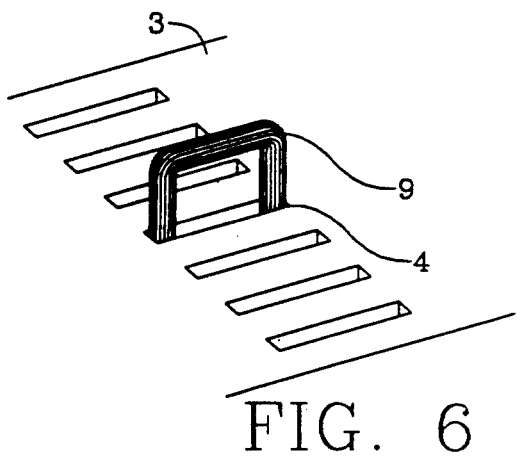
FIG. 6 is a view of a circuit board region, similar to that of FIG. 5, showing the wire formed into a protruding loop for use as a test or interconnection terminal.

FIG. 6, depicting a circuit board 3 from the same viewpoint as in FIG. 5, shows an elevated loop 9 formed through opening 4 by making the press stroke deeper and making the stripped wire portion to have a suitable length. The elevated loop 9 may serve as an interconnection terminal for connecting other components, typically by wrapping and soldering component leads, or it may serve as a test terminal for manufacturing or servicing purposes. While the flat shape of the bridge wire shown at the top of loop 9 is most suitable for forming a pad (such as pad 8 in FIG. 5), the flat shape is not essential in elevated loop 9: alternatively the protruding part could be formed into an arc, semicircle or other shape suited to particular requirements by appropriately shaping the mandrel and, if used, a lower mating cavity tool.

Figure 7:
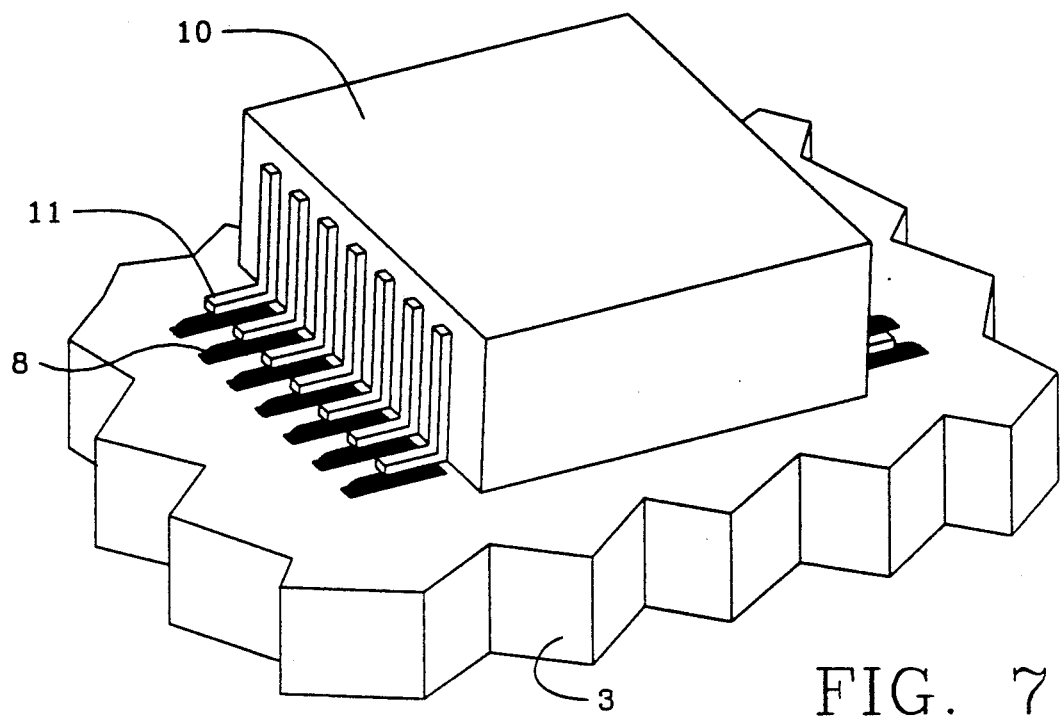
FIG. 7 depicts, on the component side of a circuit board, a surface-mounted device placed on an array of pads formed as in FIGS. 1-5

FIG. 7 shows a portion of circuit board 3 carrying a surface mounted device 10 having dual in-line interconnect leads 11, bent at right angles to seat on top of pads 8, ready for soldering.

In FIGS. 5 and 7, for clarity of illustration, pad 8 is shown protruding above the surface of board 3; however, depending on the configuration of the components to be surface-mounted, the upward surface of ad 8 may be set flush with the surface of board 3 or even recessed so as to keep the component's leads captured in a depressed cavity and to provide a barrier to avoid increased possibility of solder bridging during the soldering operation. The desired height of pad 8 is established by controlling the vertical travel of mandrel (5, FIGS. 1-3) as delivered via the vertical press and the length of the stripped wire portion (1, FIG. 1). For a flush disposition the work table may have a plain flat surface; otherwise it may be beneficial to provide a lower tool member or shaped cavity in the work table to act in cooperation with the mandrel to ensure flatness of pad 8.

Figure 8:
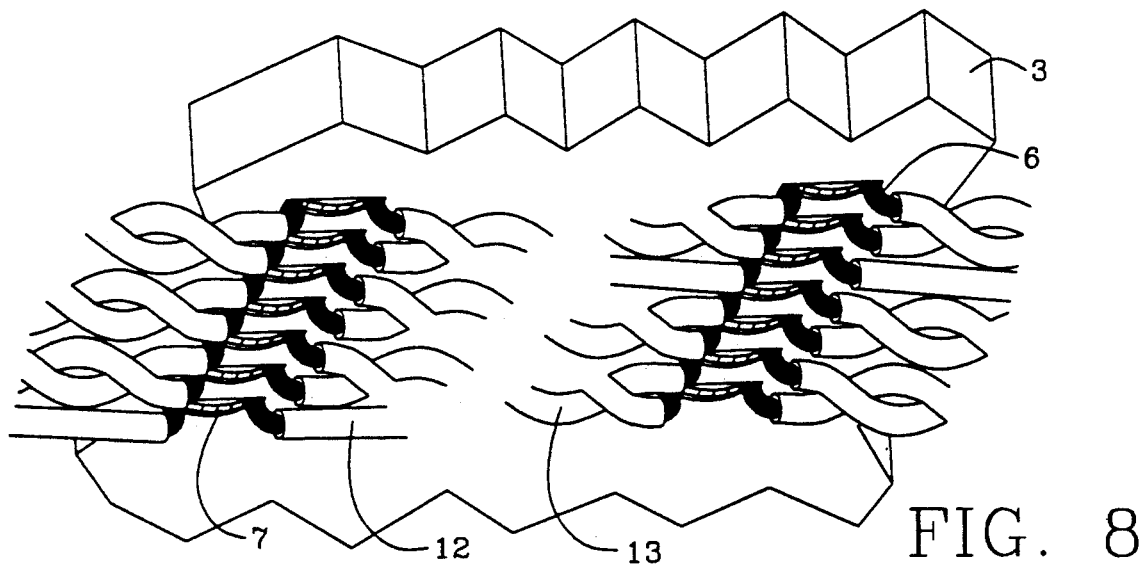
FIG. 8 depicts, on the wiring side of a circuit board such as that of FIG. 7, both single hookup wires and twisted pairs having been formed into contact loops in accordance with the present invention.

FIG. 8 illustrates pads created in accordance with this invention from insulated hookup wire in the form of both straight-through single wire 12 and twisted-pair wiring 13; in either case a loop 6 may be formed to provide either a surface mount pad (8, FIG. 5) or a terminal loop (9, FIG. 6), secured in place by filler 7, as described above in connection with FIGS. 1-7.

As part of the fabrication process of the present invention, pairs of regular hookup wires may be twisted together to form twisted pair transmission line runs between pad pairs. Apparatus and methods for such twisted pair fabrication, readily applicable to the present invention, are described in detail in U.S. Pat. No. 5,042,146, which also discusses the advantages of twisted pairs as high speed digital transmission lines.

The invention may be embodied and practiced in other specific forms without departing from the spirit and essential characteristics thereof. The present embodiments are therefore to be considered in all respects as illustrative and not restrictive, the scope of the invention being indicated by the appended claims rather than by the foregoing description; and all variations, substitutions and changes which come within the meaning and range of equivalency of the claims are therefore intended to be embraced therein.

What is claimed is:

1. An interconnecting contact element formed in a circuit board from insulated hookup wire, comprising:
   a loop, disposed in a rectangular opening in the circuit board, formed from a stripped portion of the wire so as to have a bridge portion flanked y pair of parallel side wire portions disposed one at each end of the circuit board opening; and
   a filler disposed in the cavity between the two side wire portions, adapted to anchor said loop in place.

2. The contact element as defined in claim 1 wherein said loop is formed to provide a mounting pad, defined by a surface of the bridge portion disposed near a working surface of the circuit board, for mating with an interconnecting lead of a surface-mount component.

3. The contact element as defined in claim 2 wherein said loop is formed and anchored in a manner to locate the pad substantially flus with the working surface of the circuit board.

4. The contact element as defined in claim 2 wherein said loop is formed and anchored in a manner to locate the pad in a recessed disposition relative to the working surface of the circuit board.

5. The contact element as defined in claim 1 wherein said loop is shaped and disposed to provide a protruding portion thereof extending from a working surface of the circuit board, such that the protruding portion is enabled to serve as an interconnection terminal for component leads and hookup wire, and as a test terminal.

6. The contact element as defined in claim 1 wherein the hookup wire is one of a twisted pair of like hookup wires each having a like stripped portion, the two stripped portions being made parallel and each formed into a like loop anchored in a like manner in a pair of adjacent like cavities in the circuit board so as to provide a pair of adjacent like contact elements.

7. The contact element as defined in claim 1 wherein the hookup wire is one of a plurality of like hookup wires each having a like stripped portion, the stripped portions being made parallel and each formed into a like loop anchored in a like manner in an array of adjacent like cavities in the circuit board so as to provide an array of adjacent like contact elements.

8. The contact element as defined in claim 1 wherein said filler comprises a plug pressed in place between the side wire portions.

9. The contact element as defined in claim 1 wherein said filler comprises a time-solidifying adhesive substance injected between the side wire portions.

* * * * *